United States Patent
Capriz et al.

(10) Patent No.: US 8,616,267 B2
(45) Date of Patent: Dec. 31, 2013

(54) HEAT SINK

(75) Inventors: Cesare Capriz, Castello d'argile (IT); Ugo Barucca, Bologna (IT)

(73) Assignee: Aavid Thermalloy, LLC, Laconia, NH (US)

( * ) Notice: Subject to any disclaimer, the term of this patent is extended or adjusted under 35 U.S.C. 154(b) by 952 days.

(21) Appl. No.: 12/514,176

(22) PCT Filed: Nov. 1, 2007

(86) PCT No.: PCT/US2007/023051
§ 371 (c)(1), (2), (4) Date: Oct. 28, 2009

(87) PCT Pub. No.: WO2008/063372
PCT Pub. Date: May 29, 2008

(65) Prior Publication Data
US 2010/0044015 A1    Feb. 25, 2010

(51) Int. Cl.
*F28F 7/00* (2006.01)
*H05K 7/20* (2006.01)

(52) U.S. Cl.
USPC .......................................... 165/80.4; 165/67

(58) Field of Classification Search
USPC ........ 165/80.2, 80.4, 104.33, 67; 361/679.53, 361/699, 702; 257/714, 718, 719
See application file for complete search history.

(56) References Cited

U.S. PATENT DOCUMENTS

| | | | |
|---|---|---|---|
| 4,612,978 A * | 9/1986 | Cutchaw .................. | 165/104.33 |
| 6,125,036 A | 9/2000 | Kang et al. | |
| 6,301,097 B1 * | 10/2001 | Ellsworth et al. ............. | 361/728 |
| 6,665,187 B1 * | 12/2003 | Alcoe et al. ................... | 361/719 |
| 6,745,823 B2 | 6/2004 | Brost | |
| 6,890,799 B2 | 5/2005 | Daikoku et al. | |
| 7,149,087 B2 * | 12/2006 | Wilson et al. ................. | 361/699 |
| 7,272,006 B2 * | 9/2007 | Mongia et al. ................ | 361/702 |
| 2004/0188080 A1 * | 9/2004 | Gailus et al. .................. | 165/185 |

* cited by examiner

*Primary Examiner* — Tho V Duong
(74) *Attorney, Agent, or Firm* — Wolf, Greenfield & Sacks, P.C.

(57) ABSTRACT

A fluid-cooled heat sink (1) for electronic components having a heat exchanger (2) which can be associated with at least one electronic component (3), the heat exchanger having at least one channel (6) with an inlet (7) and an outlet (8) for a cooling fluid. The heat exchanger (2) having a first outer surface (4) for contact with the electronic component (3) and a second outer surface (5). The heat sink (1) having a stiffening element (15) operating on the heat exchanger (2) at the second outer surface (5) for associating and pressing the heat exchanger (2) on the electronic component (3).

26 Claims, 8 Drawing Sheets

FIG. 3
FIG. 4
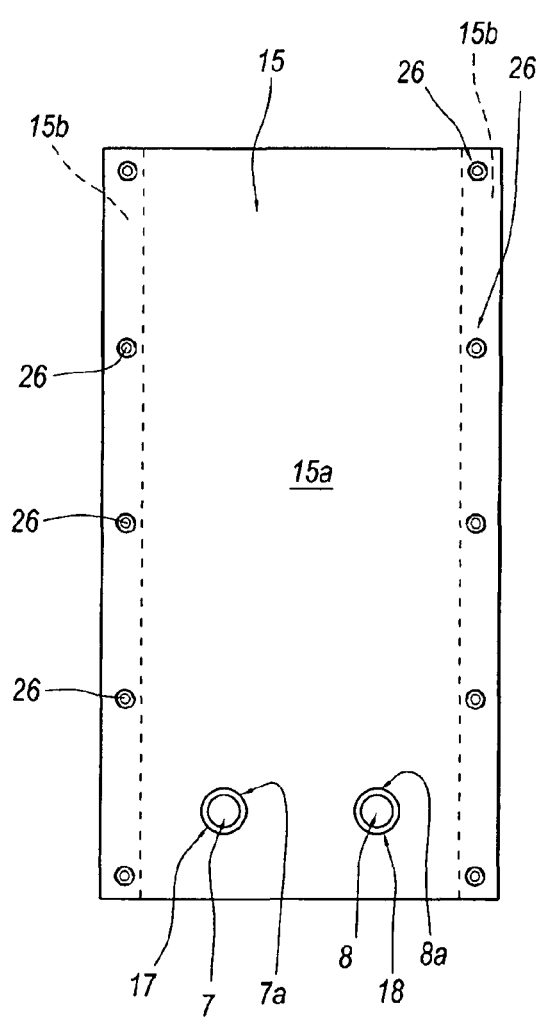
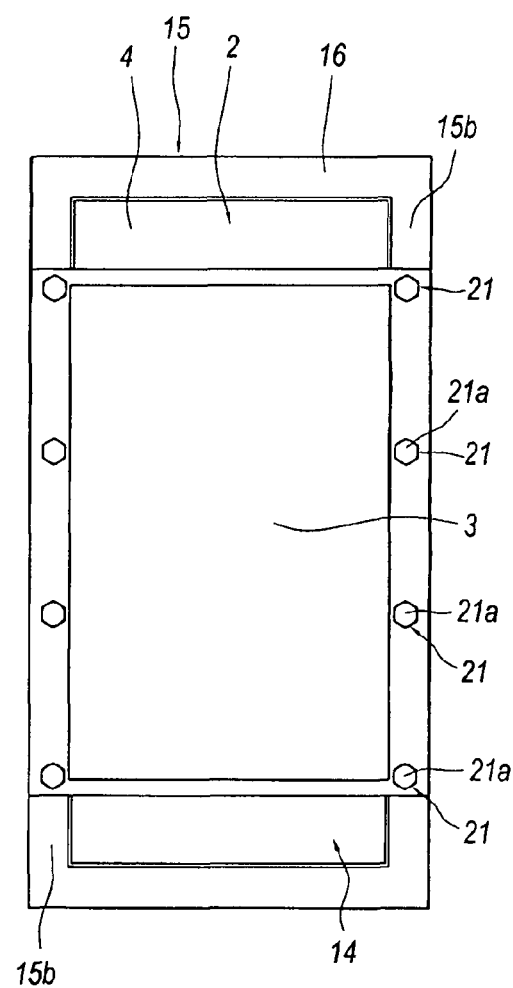

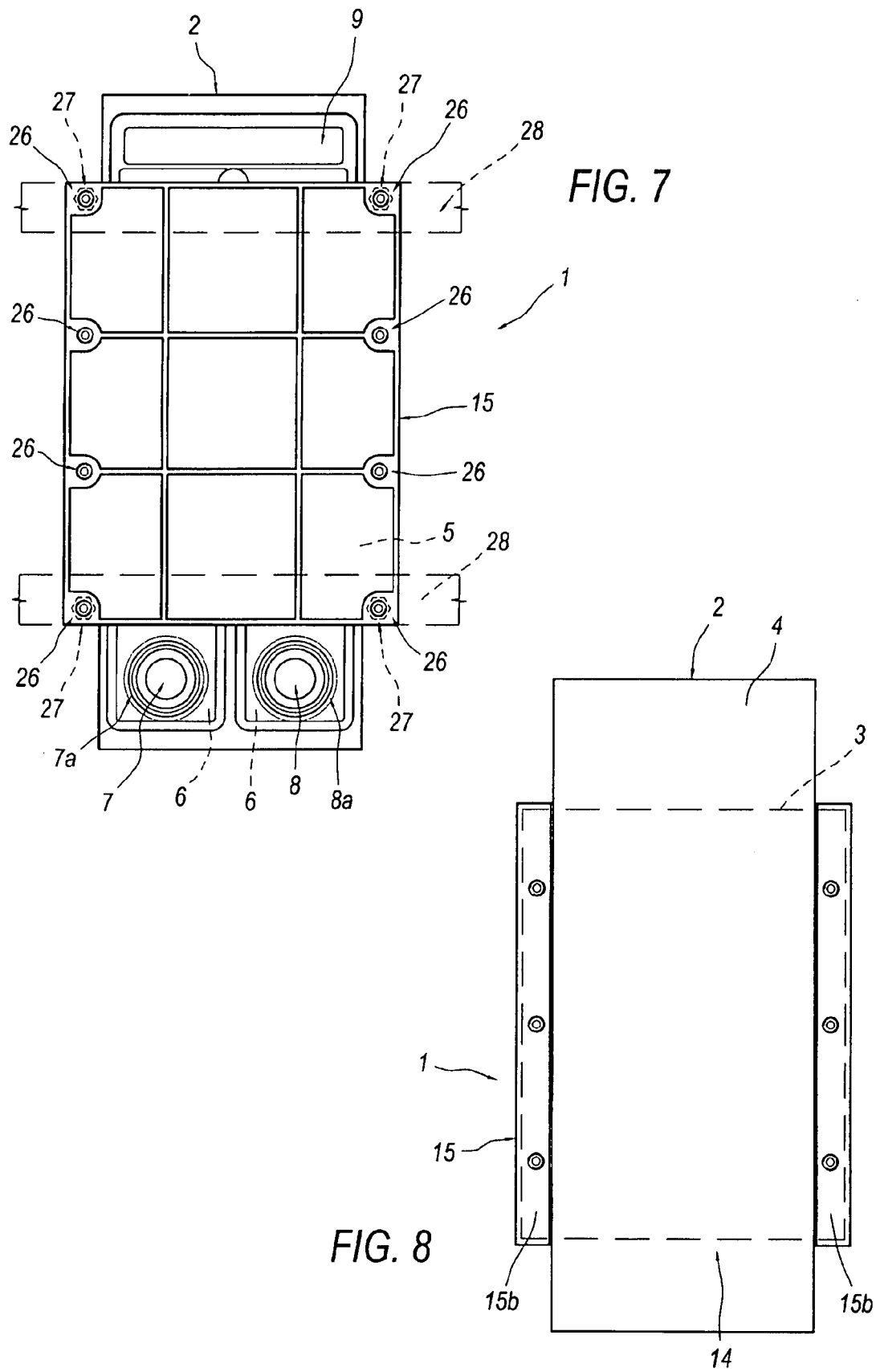

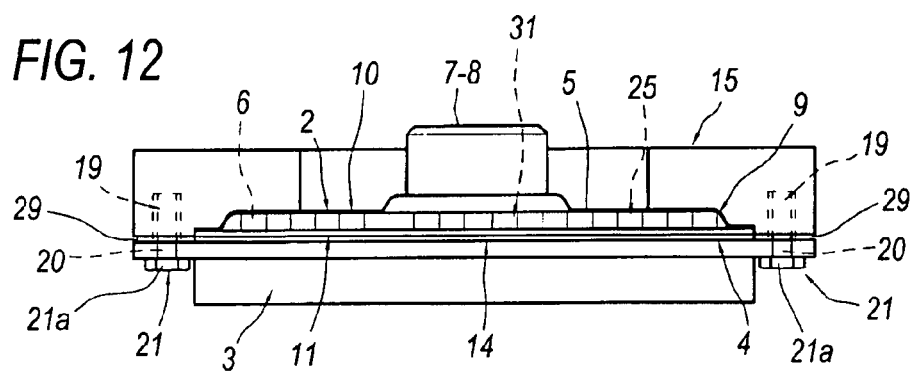
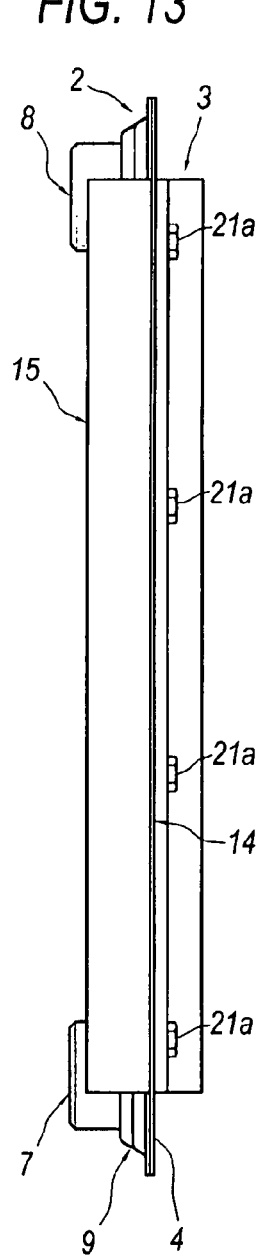
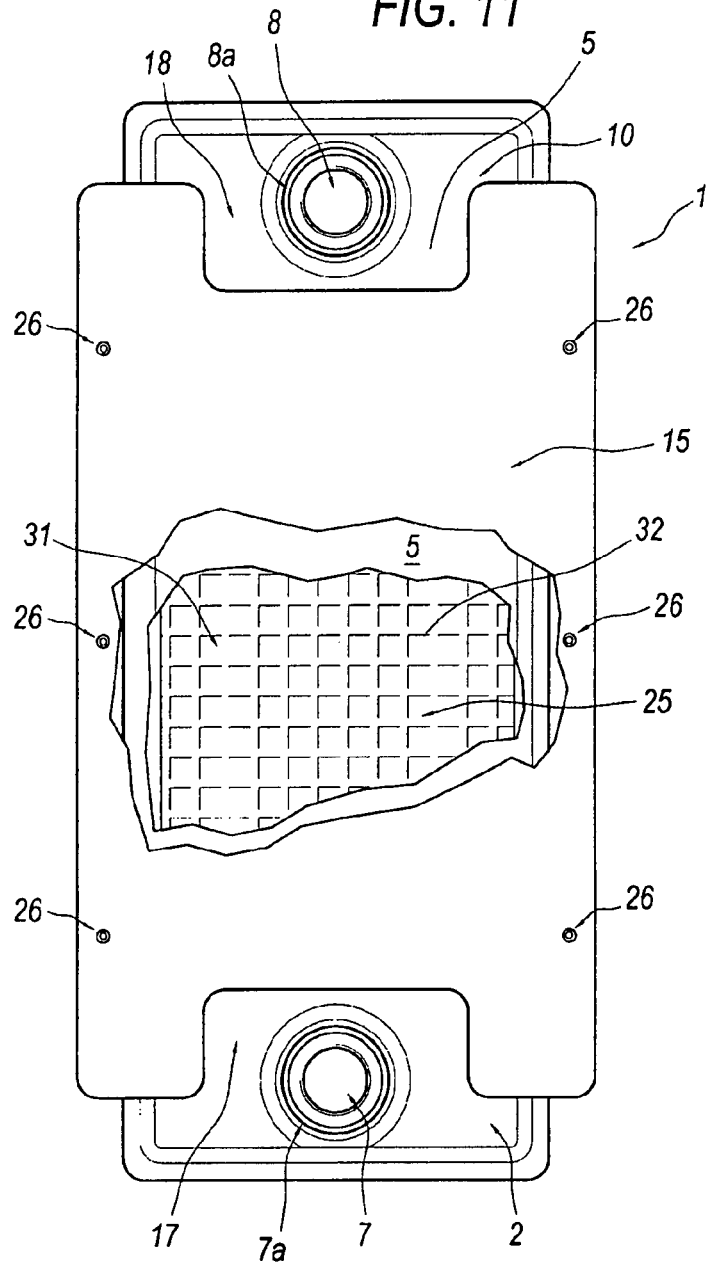

HEAT SINK

PRIORITY CLAIM

This is a U.S. national stage of application No. PCT/US07/23051, filed on Nov. 1, 2007. Priority is claimed on the following application(s): EPO, Application No.: 06425774.4, Filed: Nov. 13, 2006, the content of which is incorporated here by reference.

BACKGROUND OF THE INVENTION

1. Field of the Invention

The present invention relates to a heat sink and in particular a fluid-cooled heat sink for high power electronic components, that is to say, between around a hundred watts and thousands of watts.

2. Description of Related Art

As is known, heat sinks allow the dispersal of the heat produced in electronic circuits and components during their operation.

In particular, liquid-cooled heat sinks are known, also called liquid cooling plates, which are used when a system is required for transporting thermal energy which is more efficient than that allowed by systems based on air, natural convection or forced cooling.

Liquid-cooled heat sinks usually have a dissipation element affected by the flow of a coolant liquid, which is put in contact with the electronic component to be cooled.

The heat exchanged between the component and the dissipation element is absorbed by the liquid which, as it flows, carries it away.

Liquid-cooled heat sinks are known, such as the one described in U.S. Pat. No. 6,661,658, comprising a plate made of material with high conductivity, usually metal and able to connect to the electronic component to be cooled, coupled with a plate-shaped element, normally thinner than the former, in which the channels for circulation of the cooling liquid are made, preferably by permanent setting.

The cooling liquid circulation ducts are therefore formed by the channels made in the plate-shaped element and closed by the plate for connection to the electronic component.

The plate allows both mechanical and thermal connection of the heat sink to the component to be cooled and therefore it is usually made with dimensions which also allow it to also perform a structural function for stiffening the heat sink. For these reasons the plate is normally quite thick, relatively very heavy and made of conducting materials, for example aluminum, which make the heat sink production costs high.

As a result of the stiffness due to the very thick plate, such heat sinks do not deform enough when assembled with the electronic component.

In other words, the thermal coupling is not particularly effective on the entire contact surface because the heat sink cannot adapt completely effectively to the electronic component to be cooled.

SUMMARY OF THE INVENTION

In this context, the main purpose of the present invention is to propose a fluid-cooled heat sink for high power electronic components which is free of the above-mentioned disadvantages.

The present invention has for an aim to propose a heat sink which is particularly valid for disposing of heat and can effectively be associated with the electronic component to be cooled, irrespective of the thickness of the connecting plate.

The present invention has for another aim to propose a light and strong heat sink.

Yet another aim is to propose a fluid-cooled heat sink which guarantees an efficient thermal coupling with the electronic component to be cooled.

The present invention has for another aim to propose a heat sink which is more economical than prior art heat sinks and which is easy to produce at industrial level.

The technical purpose indicated and the aims specified are substantially achieved by a fluid-cooled heat sink having the technical features described in the detailed description below and illustrated in the accompanying drawings.

BRIEF DESCRIPTION OF THE DRAWINGS

FIG. 3 is a schematic top plan view of the heat sink of FIG. 1;

FIG. 4 is a schematic bottom plan view of the heat sink of FIG. 1;

FIG. 7 is a schematic top plan view of the heat sink of FIG. 5;

FIG. 8 is a schematic bottom plan view of the heat sink of FIG. 5;

FIG. 11 is a schematic top plan view of a fourth embodiment of a heat sink in accordance with the present invention;

FIG. 12 is a schematic front view of the heat sink of FIG. 11;

FIG. 13 is a schematic side view of the heat sink of FIG. 11;

DETAILED DESCRIPTION OF THE PRESENTLY PREFERRED EMBODIMENTS

Figure 1:
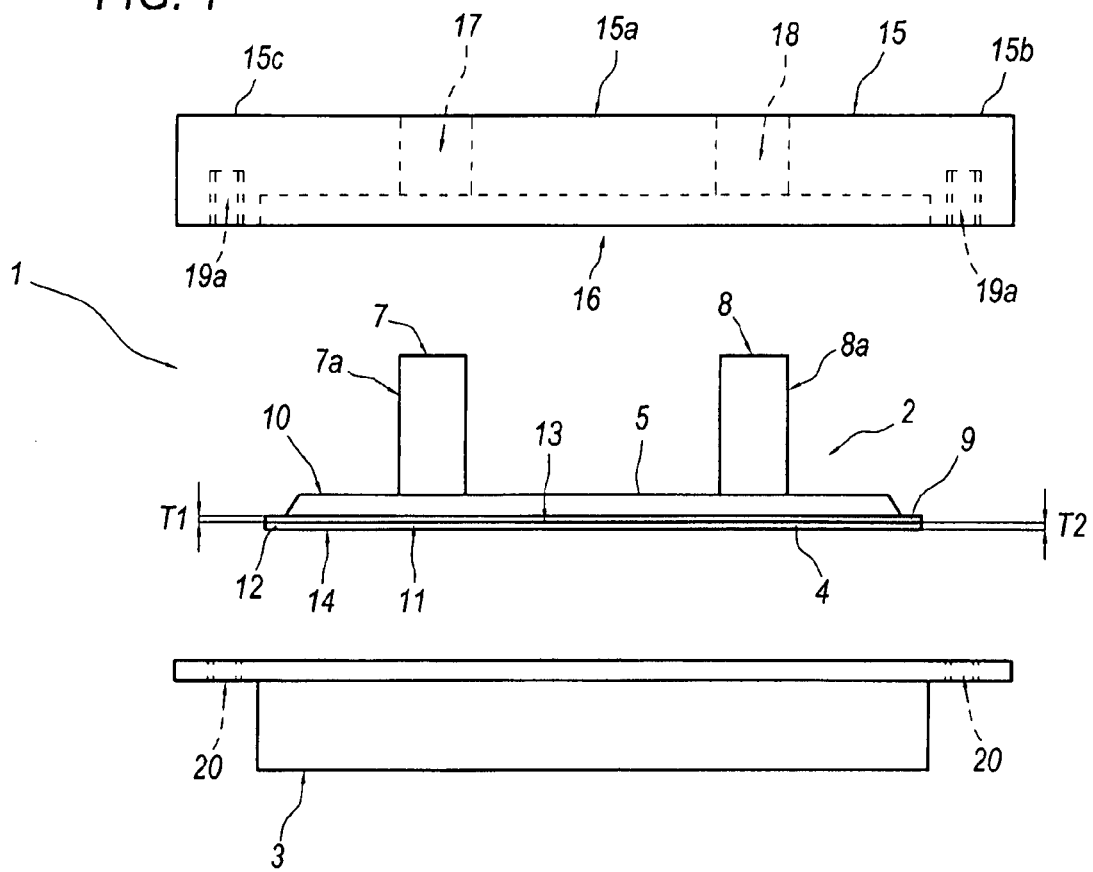
FIG. 1 is an exploded schematic front view of a first embodiment of a heat sink in accordance with the present invention.

With reference to the accompanying drawings, the numeral 1 denotes a fluid-cooled heat sink in accordance with the present invention.

The heat sink 1 is preferably for disposing of heat in electronic components with power between around a hundred watts and several thousand watts.

The heat sink 1 includes a dissipation element or heat exchanger 2, which is put in contact with at least one electronic component 3 to be cooled. As illustrated, the electronic component 3 has a flange 3a with which it is connected to the heat exchanger 2 using methods described in more detail below.

The heat exchanger 2 is affected by the flow of a coolant liquid which absorbs and carries away the heat exchanged between the component 3 and the dissipation element 2, flowing in the heat exchanger 2.

The heat exchanger 2 has a first outer surface 4 for connection to the component 3 and a second outer surface 5, these surfaces enclosing a channel 6 for circulation of the cooling liquid.

The channel 6 has an inlet 7 for the cooling fluid and an outlet 8 for it.

In the solutions illustrated, the inlet 7 and the outlet 8 of the channel 6 have a respective connector 7a, 8a for connection to a hydraulic supply circuit of the substantially known type and therefore not described.

The positions of the inlet 7 and the outlet 8 of the channel 6 are illustrated by way of example and conventionally indicated as inlet and outlet.

Similarly, the extension of the channel 6 in the heat exchanger 2 has any preferred course. In alternative embodiments not illustrated the positions of the inlet 7 and the outlet 8, depending on the extension of the corresponding channel 6 for circulation of the cooling fluid, may be any according to the different construction requirements.

The heat exchanger 2 preferably comprises a first plate 9 with thickness T1 and width Li, having a first face 10 and a second face 11. The heat exchanger 2 also comprises a second plate 12 with thickness T2 and width L2, having a first face 13 and a second face 14.

The first plate 9 and the second plate 12 are joined together and in particular the first face 13 of the second plate 12 is jointed to the second face 11 of the first plate 9 to enclose the channel 6 in which the cooling fluid flows.

As illustrated, the second face 14 of the second plate 12 comprises the outer surface 4 for connection of the heat exchanger 1 to the electronic component 3.

Moreover, the channel 6 is preferably made in the first plate 9 by permanent setting it.

In practice, the coolant fluid flows in contact with the second plate 12 and absorbs the latter's heat which by conduction propagates from the electronic component 3 through the outer surface 4.

The first and second plates 9, 12 are preferably joined to one another by high or low temperature welding or brazing spots, not illustrated.

In particular, the plates 9 and 12 are preferably made of conducting material, for example copper or aluminium or their alloys.

The thickness T1 of the plate 9 is preferably between several tenths of a millimetre and several millimetres to minimise the material used and optimise working.

The thickness T2 of the plate 12 is preferably between several tenths of a millimetre and several millimetres to minimise the material used to produce the plate.

The reduced thicknesses T1 and T2 are such that, as described in more detail below, the last exchanger 2 has a structure which can be deformed by bending, able to adapt to the electronic component 3 to be cooled.

Figure 2:
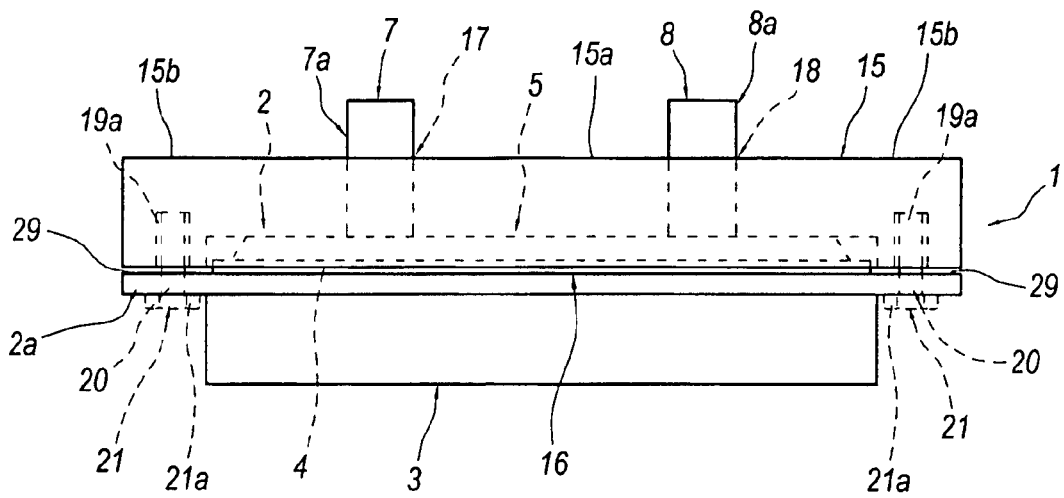
FIG. 2 is a schematic front view of the heat sink of FIG. 1.

In particular, in the preferred embodiment illustrated by way of example in FIGS. 1 and 2, the plate 9 has a thickness T1 of around 1 mm. Moreover, the plate 12 preferably has a thickness T2 of around 1 mm.

The heat sink 1 also includes a stiffening element 15 for associating the heat exchanger 2 with the electronic component 3.

In particular, the stiffening element 15 operates on the heat exchanger 2 at the second outer surface 5 and, in particular, has a face 16 for contact with second outer surface 5.

Advantageously, the stiffening element 15 has a central portion 15a, including contact face 16, designed to impact on the heat exchanger 2 to press it on the electronic component The stiffening element 15 also has, positioned on opposite sides of the central portion 15a, lateral portions 15b preferably designed to fix the element 15 to the electronic component 3, as described in more detail below.

The stiffening element 15 is preferably made of plastic or a composite material or metal which can be moulded or stamped (for example die-cast or stamped plate).

The element 15 has a stiff structure so that it gives the heat exchanger 2 in particular the mechanical properties necessary for assembly with the electronic component 3.

The stiffening element 15 is preferably made as a single body to optimise its production at industrial level.

As illustrated in FIGS. 1 to 4, the stiffening element 15 affects the whole of the first face 10 of the first plate 9 which therefore forms the second outer surface 5 for connection to the element 15. The outer surface 5 is substantially flat and, similarly, the face 16 for connecting the stiffening element 15 to the heat exchanger 2 is also substantially flat.

The stiffening element 15 has a first and a second opening 17, 18 for the passage of the inlet 7 and the outlet 8 of the channel 6 for circulation of the cooling fluid.

In particular, the openings 17 and 18 are for the passage of the connectors 17a and 18a.

The stiffening element 15 has engagement means 19 for the means 21 for fixing the component 3 to the element 15, preferably using the flange 3a.

The engagement means 19 are preferably positioned at the lateral portions 15b of the stiffening element 15.

In the embodiments illustrated by way of example, the engagement means 19 consist of a plurality of holes 19, preferably blind holes, with a thread in which the fixing means 21 consisting for example of screws 21a engage.

FIGS. 1 and 2 show how the engagement means 19 preferably comprise threaded bushings 19a inserted in the stiffening element 15.

Engaging in the holes 19 or in the bushings 19a through holes 20 made in the flange 3a, the screws 21a pull the stiffening element 15 towards the electronic component 3 so that the effectively adheres heat exchanger 2 to the component 3, optimising the heat exchange for component cooling. In this way, when the heat sink 1 is assembled, the heat exchanger 2 is locked on the electronic component 3 by the stiffening element 15 which presses the heat exchanger 2 under the action of the fixing means 21.

The stiffening element 15 gives the heat exchanger 2 enough stiffness for assembly and the face 14 of the second plate 12 is firmly in contact with the electronic component 3, since the heat exchanger 2 is forced onto the component 3 by the stiffening element 15.

It should be noticed, as illustrated in FIGS. 2, 6, 10, 12 and 16, that, in a heat sink 1 assembled on the electronic component 3, between the lateral portions 15b of the stiffening element 15 and the flange 3a of the electronic component 3 there is a gap 29.

In other words, the maximum height H1 of the heat exchanger 2 is greater than the distance H2 between the face 16 of the stiffening element 15, substantially in contact with the first face 10 of the first plate 9, and the surfaces 33 of the lateral portions 3b of the stiffening element 15 opposite the flange 3a.

Figure 16:
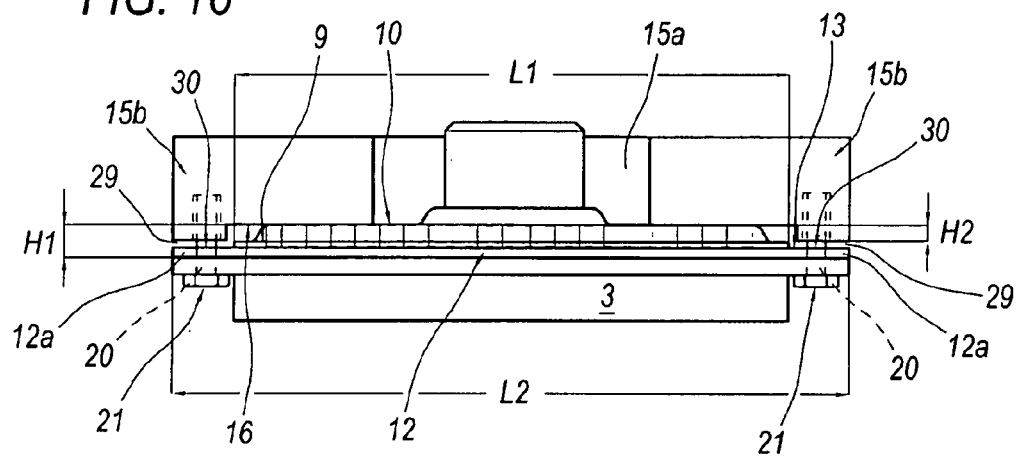
FIG. 16 is a schematic front view of the heat sink of FIG. 14.

With reference to FIG. 16, the maximum height H1 of the heat exchanger 2 is greater than the distance H2 between the face 16 of the stiffening element 15 substantially in contact with the first face 10 of the first plate 9 and the surfaces 33 of the lateral portions 3b of the stiffening element 15 opposite the first face 13 of the second plate 12 which is facing the first plate 9.

Figure 17:
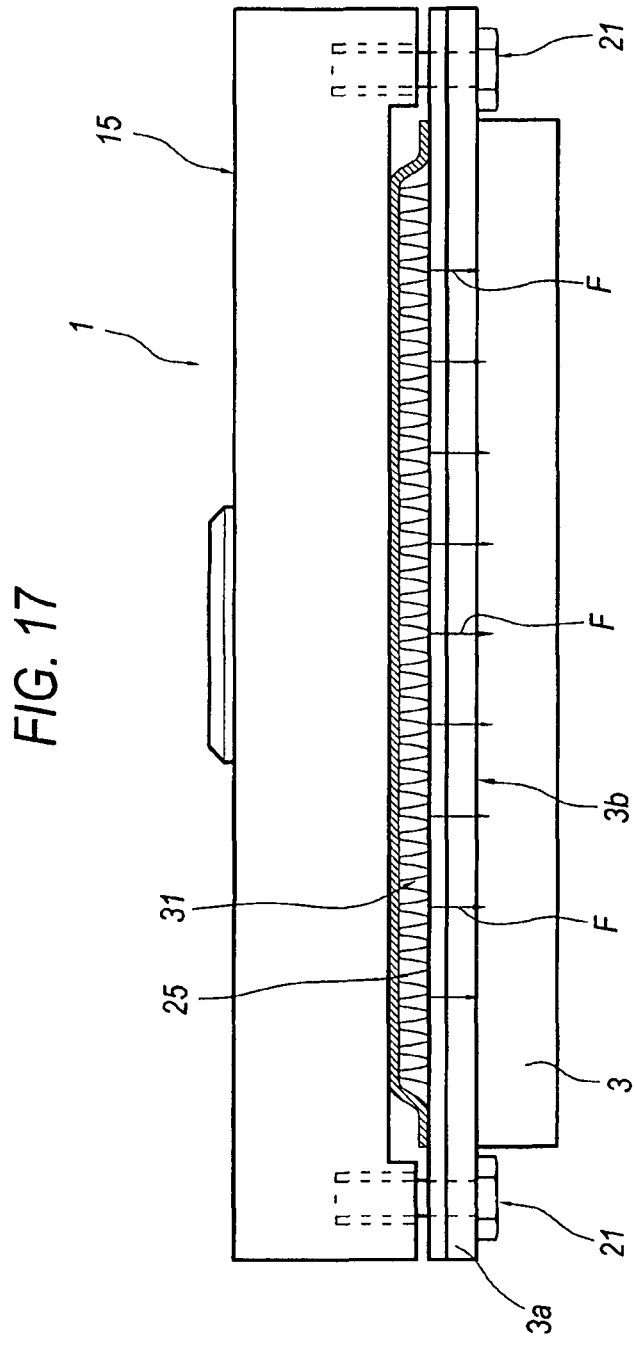
FIG. 17 is a schematic front view of a preferred application of a heat sink in accordance with the present invention.

In particular FIG. 17 illustrates a preferred heat sink 1 application.

It should be noticed that the gap 29 is such that it allows, through the action of the fixing means 21, suitable pressure, schematically indicated with the arrows F, of the heat exchanger 2 and the electronic component 3 flange 3a, producing greater contact between the two, in particular at a central zone 3b of the electronic component 3 where more heat is usually produced.

It should be noticed that, as illustrated in FIGS. 3, 6, 7, 11 and 14, the stiffening element 15 has threaded holes 26 for bolts 27.

In particular, the holes 26 allow the heat sink 1 to be assembled to a structure 28, which is not part of the present invention and therefore is not described in detail, which supports the electronic components 3 by means of the stiffening element 15.

Figure 5:
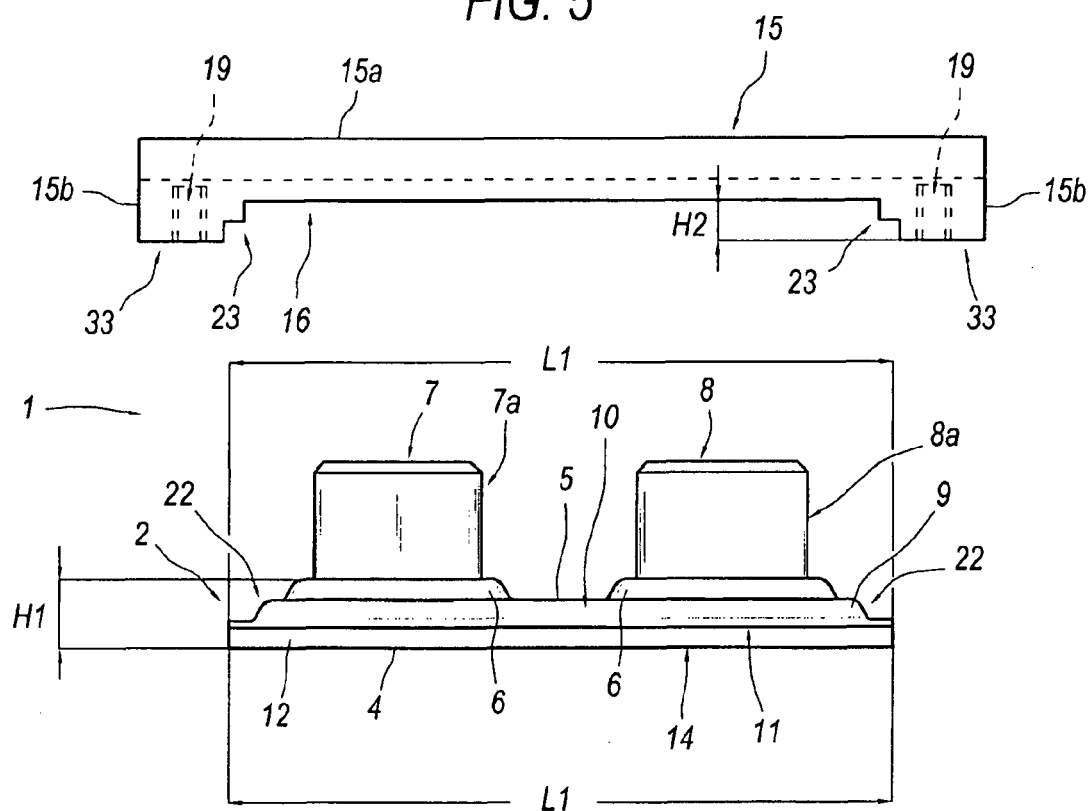
FIG. 5 is an exploded schematic front view of a second embodiment of a heat sink in accordance with the present invention.
Figure 6:
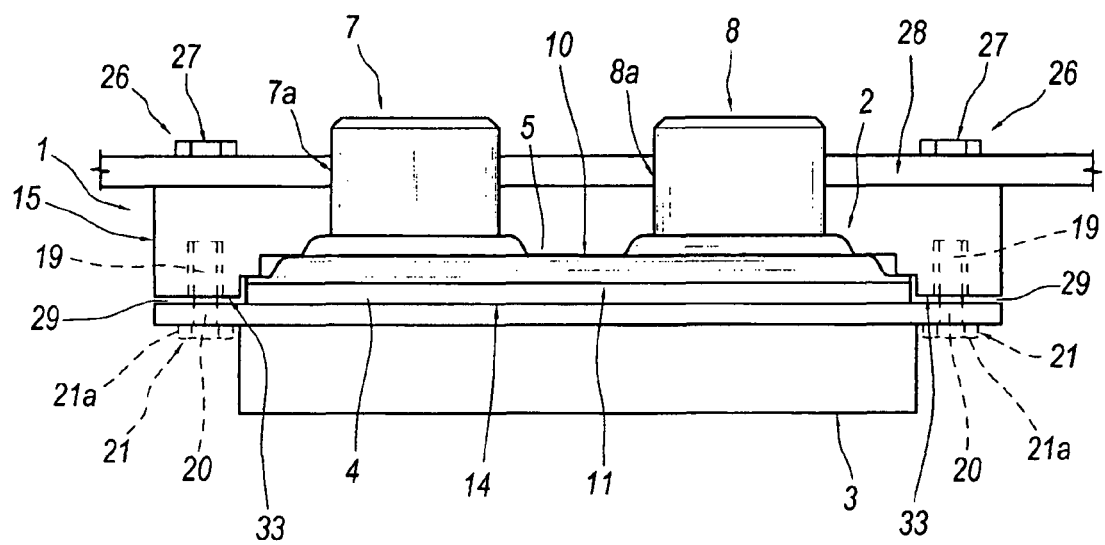
FIG. 6 is a schematic front view of the heat sink of FIG. 5 in a preferred application configuration.

In the solution illustrated in FIGS. 5 and 6, the connecting face 16 of the stiffening element 15, that is to say the central portion 15a, is close to the first face 10 of the plate 9.

In practice, for example, substantially curved portions 22 of the plate 9 correspond to substantially straight portions 23 of the stiffening element 15 connecting face 16.

In this way, the pressure applied by the stiffening element 15 on the heat exchanger 2 is distributed on the outer surface 5. In particular, by appropriately shaping the stiffening element 15, the load on the heat exchanger 2 can be appropriately concentrated according to requirements, in a way not described in further detail.

Figure 9:
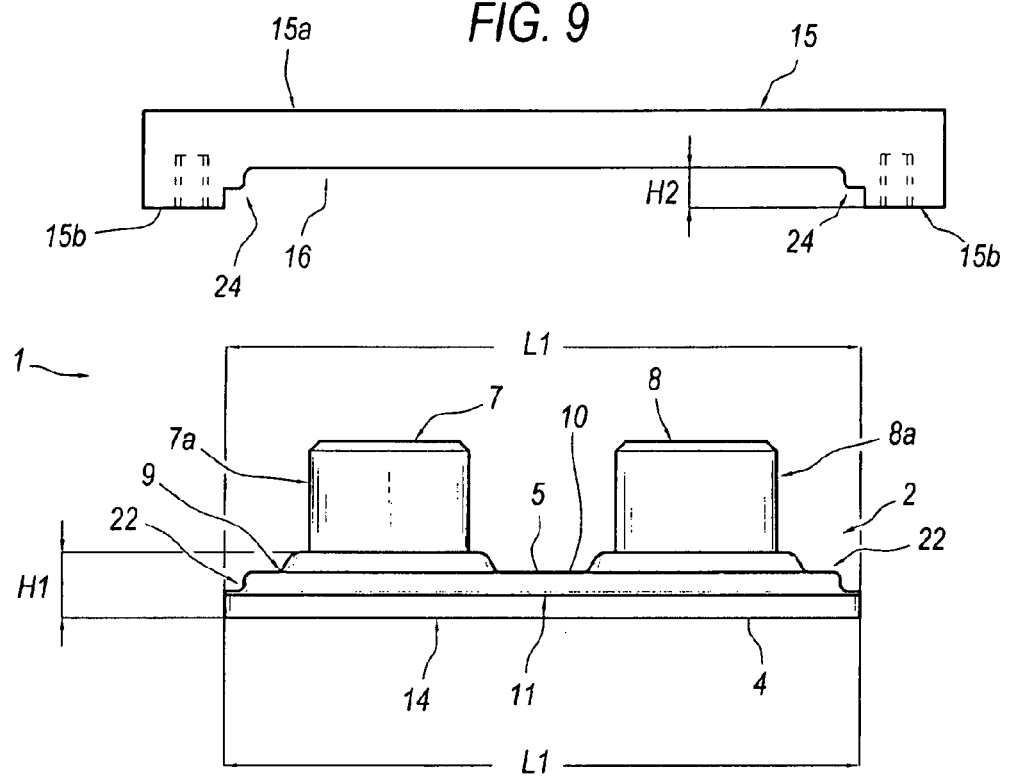
FIG. 9 is an exploded schematic front view of a third embodiment of a heat sink in accordance with the present invention.
Figure 10:
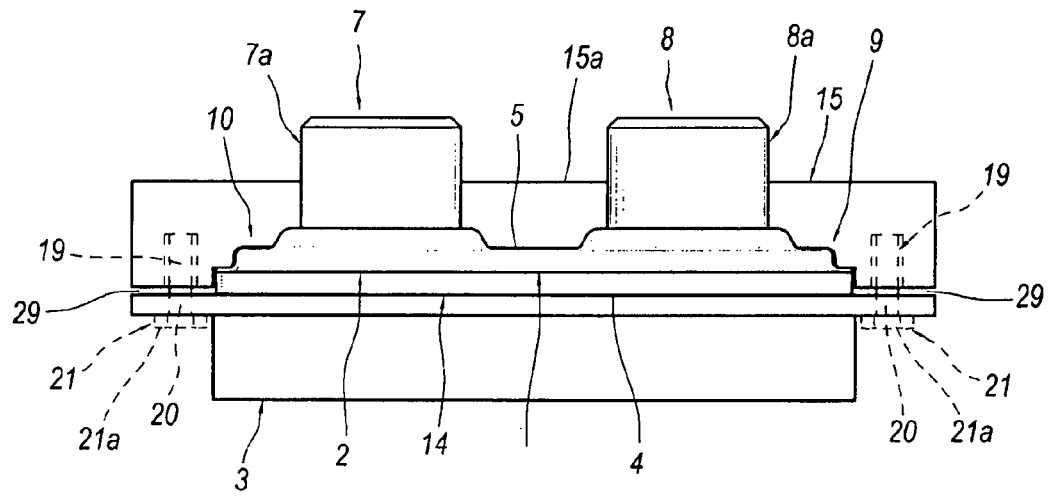
FIG. 10 is a schematic front view of the heat sink of FIG. 9 in a preferred operating configuration.

In particular with reference to FIGS. 9 and 10 it should be noticed that the contact face 16 is shaped to match the first face 10 of the plate 9. Substantially curved portions 22 of the plate 9 correspond to substantially curved portions 24 of the contact face 16, substantially following the same contour as the portions 22.

In this way, the pressure applied by the stiffening element 15 against the heat exchanger 2 is better distributed on the portion of the first face 10 of the heat exchanger 2 affected by the stiffening element 15.

In particular with reference to FIGS. 7 and 11, the outer surface 5 of the heat exchanger 2 affected by the stiffening element 15 includes a portion of the first face 10 of the first plate 9.

Figure 15:
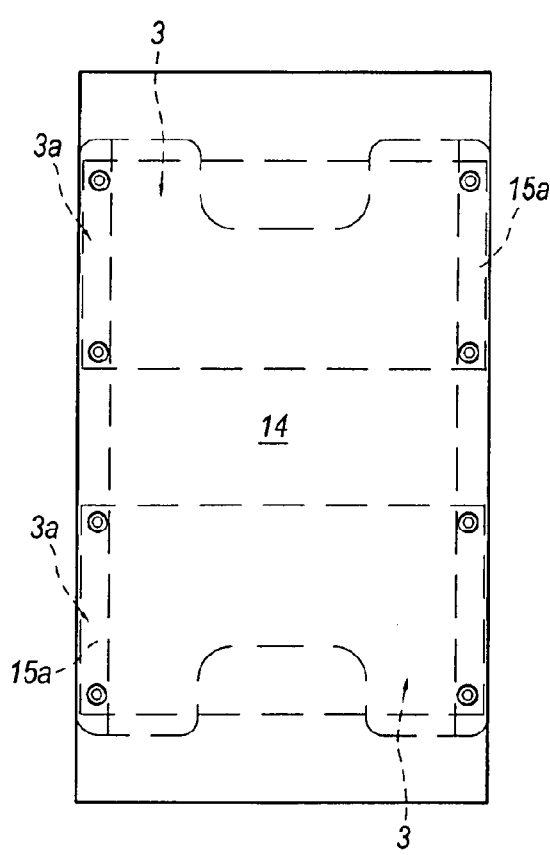
FIG. 15 is a schematic bottom plan view, with some parts cut away for greater clarity, of the heat sink of FIG. 14.
Figure 14:
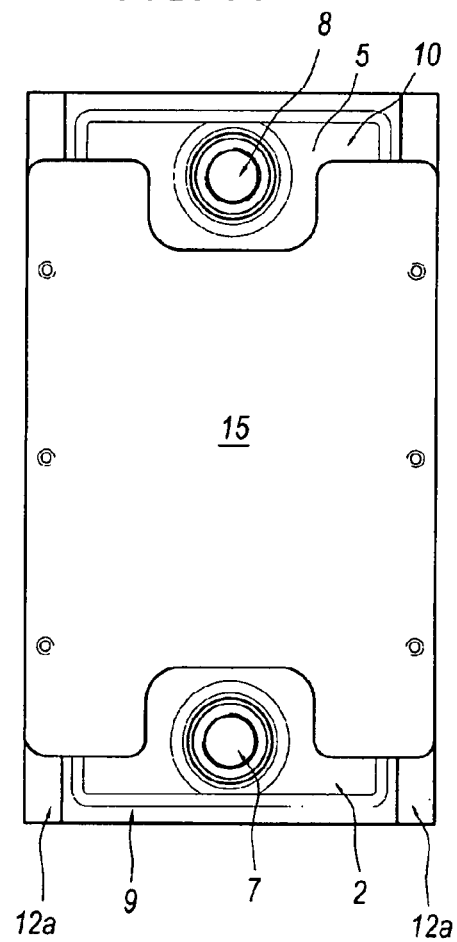
FIG. 14 is a schematic top plan view of a fifth embodiment of a heat sink in accordance with the present invention.

As illustrated in FIGS. 14, 15 and 16, the width L2 of the second plate 12 is greater than the width L1 of the first plate 9.

In this way, an outer perimeter portion 12a is defined on the second plate 12, internally delimited by the first plate 9.

In the perimeter portion 12a there are holes 30 for the passage of the screws 21a. In this way, the electronic component 3 flange 3a, and therefore the electronic component 3 itself, the dissipation element 2 and the stiffening element 15, are positioned relative to one another, making assembly of the components particularly easy. It should also be noticed that the first plate 9 is joined on the second plate 12 substantially at the perimeter portion 12a.

The perimeter portion 12a is such that, during the joining of the two plates 9, 12, the weld material does not affect and does not reach the second face 14 of the plate 12 which therefore retains unchanged its surface properties such as roughness, not requiring further treatments which could compromise its thermal efficiency and mechanical strength. In particular with reference to FIGS. 11, 12, 16 and 17, it should be noticed that the heat sink 1 includes structural stiffening elements 25 positioned in the channel 6.

The stiffening elements 25 prevent the channel 6 from being crushed under the pressure applied by the stiffening element 15, but keep the thicknesses T1 and T2 of the plates 9 and 12 relatively low.

Advantageously, the structural stiffening means 25 substantially occupy the entire height of the channel 6.

The heat sink 1 also includes elements 31 for generating turbulence in the cooling fluid which flows in the channel 6 during heat sink 1 operation.

The structural stiffening elements 25 and the elements 31 for generating a turbulence are formed by a so-called "fret" 32 inserted in the channel 6.

The fret 32, otherwise know as a "turbulator" allows the heat exchanger 2 to resist the pressure from the stiffening element 15 and generates turbulence in the fluid passing through it. The fret 32 is preferably of the staggered type. As illustrated in FIG. 17, the fret is preferably corrugated.

In this way it is possible to keep the thicknesses T1 and T2 of the plates 9 and 12 further contained, guaranteeing suitable heat exchange between the cooling fluid and the electronic component 3 thanks to the elements 31 for generating turbulence.

The invention described brings important advantages. The use of thin plates, thanks to the presence of the stiffening element which performs structural functions, allows a significant reduction in the quantity of material used, thus reducing the weight and costs of the heat sink. The mechanical properties necessary for correct assembly of the heat sink on the electronic component are required, as indicated, of the stiffening element which, preferably being made of plastic, is economical and easy to work.

The stiffening element shaped to match the heat exchanger allows it to be pressed against the electronic component, guaranteeing effective heat exchange. The thinness of the heat exchanger allows it a minimum deformability by bending, which guarantees optimum adhesion on the electronic component to be cooled.

The appropriately shaped stiffening element also allows the forces and tensions due to the fixing means to be distributed in the most suitable zones of the electronic component, for example at the centre.

The invention described has evident industrial applications and may be modified and adapted in several ways without thereby departing from the scope of the inventive concept. Moreover, all details of the invention may be substituted by technically equivalent elements.

The invention claimed is:

1. A fluid-cooled heat sink assembly comprising:
    a heat exchanger comprising a first plate having opposed first and second faces, and a second plate having opposed first and second faces, the second face of the first plate being joined to the first face of the second plate at a perimeter of the first and second plates to form a closed channel, the first plate having an inlet and an outlet for cooling fluid in the channel and having a central area spaced inwardly and away from the perimeter of the first plate and located between opposite sides of the perimeter of the first plate;
    a stiffening element having a central portion and adjoining lateral portions on opposite sides of the central portion, the central portion being located inwardly and away from the lateral portions and having a contact surface positioned against the first face at the central area of the first plate, the stiffening element being formed as a single, unitary body; and an electronic component received against said second face of said second plate;

wherein said stiffening element is attached to the electronic component at said lateral portions of said stiffening element so that said contact surface is pressed against the central area of the first face of the first plate and the electronic component is pressed against the second face of the second plate.

2. The heat sink assembly of claim 1, wherein the second plate is wider than the first plate, the second plate having a perimeter portion extending between the electronic component and the lateral portions of the stiffening element.

3. The heat sink assembly of claim 2, wherein the perimeter portion of the second plate is separated from the lateral portions of the stiffening element by a gap.

4. The heat sink assembly of claim 1, wherein a flange of the electronic component is separated from the lateral portions of the stiffening element by a gap.

5. The heat sink assembly of claim 1, further comprising means for drawing the electronic component toward said lateral portions of said stiffening element, said means comprising threaded holes in one of said stiffening element and said electronic component, and screws passing through holes in the other of said stiffening element and said electronic component.

6. The heat sink assembly of claim 1, wherein the channel is formed in the first plate and is enclosed by the second plate, the second plate being essentially flat.

7. The heat sink assembly of claim 6, wherein the first face of the first plate has a contour, the contact surface of the stiffening element matching the contour.

8. The heat sink assembly of claim 1, wherein the contact surface is substantially flat.

9. The heat sink assembly of claim 1, wherein the stiffening element is stamped from sheet metal.

10. The heat sink assembly of claim 1, wherein the stiffening element is made of molded plastic.

11. The heat sink assembly of claim 1, further comprising a structural stiffener inside the channel in the heat exchanger.

12. The heat sink assembly of claim 1, wherein the central portion of the stiffening element has openings for receiving the inlet and the outlet.

13. The heat sink assembly of claim 1, wherein the inlet and the outlet are situated outside the stiffening element.

14. The heat sink assembly of claim 1, wherein the electronic component comprises a flange extending parallel to and spaced from said lateral portions of said stiffening element.

15. A fluid-cooled heat sink assembly comprising:
a heat exchanger comprising a first plate having opposed first and second faces, and a second plate having opposed first and second faces, the second face of the first plate being joined to the first face of the second plate at a perimeter of the first and second plates to form a closed channel, the first plate having an inlet and an outlet for cooling fluid in the channel and having a central area spaced inwardly and away from the perimeter of the first plate and located between opposite sides of the perimeter of the first plate;

a stiffening element having a central portion and adjoining lateral portions on opposite sides of the central portion, the central portion being located inwardly and away from the lateral portions and having a contact surface positioned against the first face at the central area of the of the first plate, the stiffening element being formed as a single, unitary body; and means for drawing an electronic component toward and into contact with the second plate so that said contact surface is pressed against the first face of the first plate and the electrical component is pressed against the second face of the second plate.

16. The heat sink assembly of claim 15, wherein the second plate is wider than the first plate, the second plate having a perimeter portion extending parallel to the lateral portions of the stiffening element.

17. The heat sink assembly of claim 16, wherein the perimeter portion is separated from the lateral portions of the stiffening element by a gap.

18. The heat sink assembly of claim 15, wherein the lateral portions of the stiffening element are recessed from the second face of the second plate by a gap.

19. The heat sink assembly of claim 15, wherein the means for drawing said electronic component toward said lateral portions of said stiffening element comprises threaded holes in one of said stiffening element and said electronic component, and screws passing through holes in the other of said stiffening element and said electronic component.

20. The heat sink assembly of claim 15, wherein the channel is formed in the first plate and is enclosed by the second plate, the second plate being essentially flat.

21. The heat sink assembly of claim 15, wherein the contact surface is substantially flat.

22. The heat sink assembly of claim 15, wherein the stiffening element is stamped from sheet metal.

23. The heat sink assembly of claim 15, wherein the stiffening element is made of molded plastic.

24. The heat sink assembly of claim 15, further comprising a structural stiffener inside the channel in the heat exchanger.

25. The heat sink assembly of claim 14 wherein the central portion of the stiffening element has openings for receiving the inlet and the outlet.

26. The heat sink assembly of claim 15, wherein the inlet and the outlet are situated outside the stiffening element.

* * * * *

UNITED STATES PATENT AND TRADEMARK OFFICE
CERTIFICATE OF CORRECTION

| | | |
|---|---|---|
| PATENT NO. | : 8,616,267 B2 | Page 1 of 1 |
| APPLICATION NO. | : 12/514176 | |
| DATED | : December 31, 2013 | |
| INVENTOR(S) | : Cesare Capriz et al. | |

It is certified that error appears in the above-identified patent and that said Letters Patent is hereby corrected as shown below:

On the Title Page of the Issued Patent, please insert Item 30, the foreign priority claim as follows:

--EPO, Application No. 06425774.4, filed November 13, 2006.--

Signed and Sealed this
Eighteenth Day of March, 2014

Michelle K. Lee
*Deputy Director of the United States Patent and Trademark Office*